US009870199B2

(12) United States Patent
Kumar et al.

(10) Patent No.: US 9,870,199 B2
(45) Date of Patent: Jan. 16, 2018

(54) GENERATING COMPACT REPRESENTATIONS OF HIGH-DIMENSIONAL DATA

(71) Applicant: Google Inc., Mountain View, CA (US)

(72) Inventors: Sanjiv Kumar, White Plains, NY (US); Xinnan Yu, New York, NY (US)

(73) Assignee: Google LLC, Mountain View, CA (US)

( * ) Notice: Subject to any disclaimer, the term of this patent is extended or adjusted under 35 U.S.C. 154(b) by 123 days.

(21) Appl. No.: 14/710,467

(22) Filed: May 12, 2015

(65) Prior Publication Data

US 2016/0335053 A1 Nov. 17, 2016

(51) Int. Cl.
*G06F 15/00* (2006.01)
*G06F 5/01* (2006.01)
*G06N 99/00* (2010.01)
*H03M 7/30* (2006.01)
*G06K 9/62* (2006.01)

(52) U.S. Cl.
CPC ............ *G06F 5/017* (2013.01); *G06K 9/6232* (2013.01); *G06N 99/005* (2013.01); *H03M 7/30* (2013.01)

(58) Field of Classification Search
None
See application file for complete search history.

(56) References Cited

U.S. PATENT DOCUMENTS

2006/0085497 A1* 4/2006 Sehitoglu .............. G06F 17/142
708/405

OTHER PUBLICATIONS

Ailon and Chazelle, "Approximate nearest neighbors and the fast Johnson-Lindenstrauss transform," Proceedings of the thirty-eighth annual ACM symposium on Theory of computing, pp. 557-563, May 2006.
Charikar, "Similarity estimation techniques from rounding algorithms," Proceedings of the thirty-fourth annual ACM symposium on Theory of computing, pp. 380-388, May 2002.
Dasgupta et al., "Fast locality-sensitive hashing," In ACM SIGKDD Conference on Knowledge Discovery and Data Mining, Aug. 2011, pp. 1073-1081.

(Continued)

*Primary Examiner* — Michael D Yaary
(74) *Attorney, Agent, or Firm* — Fish & Richardson P.C.

(57) ABSTRACT

Methods, systems, and apparatus, including computer programs encoded on computer storage media, for augmenting neural networks with an external memory. One of the methods includes receiving a plurality of high-dimensional data items; generating a circulant embedding matrix for the high-dimensional data items, wherein the circulant embedding matrix is a matrix that is fully specified by a single vector; for each high-dimensional data item, generating a compact representation of the high-dimensional data item, comprising computing a product of the circulant embedding matrix and the high dimensional data item by performing a circular convolution of the single vector that fully specifies the circulant embedding matrix and the high dimensional data item using a Fast Fourier Transform (FFT); and generating a compact representation of the high dimensional data item by computing a binary map of the computed product.

18 Claims, 4 Drawing Sheets

(56) References Cited

OTHER PUBLICATIONS

Gong et al., "Iterative quantization: A procrustean approach to learning binary codes for largescale image retrieval," IEEE Transactions on Pattern Analysis and Machine Intelligence, 35(12):2916-2929, Dec. 2013.

Gong et al., "Learning binary codes for high-dimensional data using bilinear projections," IEEE International Conference on Computer Vision and Pattern Recognition (CVPR), Jun. 2013, pp. 484-491.

Gray, "Toeplitz and circulant matrices: A review," Foundations and Trends® in Communications and Information Theory: vol. 2: No. 3, pp. 155-239, Jan. 2006.

Hinrichs and Vybíral, "Johnson-Lindenstrauss lemma for circulant matrices," Random Structures & Algorithms, 39(3):391-398, Oct. 2011.

Vybíral, "A variant of the Johnson—Lindenstrauss lemma for circulant matrices" Journal of Functional Analysis, 260(4):1096-1105, Feb. 2011.

Zhang and Cheng, "New bounds for circulant Johnson-Lindenstrauss embeddings," arXiv preprint arXiv:1308.6339v1, Aug. 2013.

* cited by examiner

GENERATING COMPACT REPRESENTATIONS OF HIGH-DIMENSIONAL DATA

BACKGROUND

This specification relates to generating compact representations of high-dimensional data.

In order to efficiently operate on high-dimensional data items, many systems generate a compact representation of the data items. For example, some systems represent high-dimensional data using binary codes, i.e., generate binary embeddings of the high-dimensional data items. The binary embeddings can then be used to represent the high-dimensional data items in retrieval or other data processing tasks.

SUMMARY

In general, one innovative aspect of the subject matter described in this specification can be embodied in methods that include the actions of receiving a plurality of high-dimensional data items; generating a circulant embedding matrix for the high-dimensional data items, wherein the circulant embedding matrix is a matrix that is fully specified by a single vector; for each high-dimensional data item, generating a compact representation of the high-dimensional data item, comprising computing a product of the circulant embedding matrix and the high dimensional data item by performing a circular convolution of the single vector that fully specifies the circulant embedding matrix and the high dimensional data item using a Fast Fourier Transform (FFT); and generating a compact representation of the high dimensional data item by computing a binary map of the computed product.

Other embodiments of this aspect include corresponding computer systems, apparatus, and computer programs recorded on one or more computer storage devices, each configured to perform the actions of the methods. A system of one or more computers can be configured to perform particular operations or actions by virtue of software, firmware, hardware, or any combination thereof installed on the system that in operation may cause the system to perform the actions. One or more computer programs can be configured to perform particular operations or actions by virtue of including instructions that, when executed by data processing apparatus, cause the apparatus to perform the actions.

The foregoing and other embodiments can each optionally include one or more of the following features, alone or in combination. In some implementations the single vector appears as a first row of the matrix and each subsequent row vector in the circulant embedding matrix is a vector whose entries are rotated one entry to the right relative to a preceding row vector in the circulant embedding matrix.

In other implementations the single vector appears as a first column of the matrix and each subsequent column in the circulant embedding matrix is a column vector whose entries are rotated one entry below relative to a preceding column in the circulant embedding matrix.

In some aspects generating the circulant embedding matrix comprises generating each element of the single vector that fully specifies the circulant embedding matrix independently from a standard normal distribution.

In other aspects generating the circulant embedding matrix comprises learning each element of the single vector that fully specifies the circulant embedding matrix.

In additional aspects learning each element comprises receiving a training data matrix which represents a set of training data; defining an initial circulant embedding matrix; computing a binary matrix by computing a binary map of the product of the training data matrix and the initial circulant embedding matrix; defining an objective function that is dependent on the circulant embedding matrix, the training data matrix and the binary matrix; and optimizing the objective function such that the distortion due to binarization and correlation between the rows of the circulant embedding matrix are minimized.

In some implementations optimizing the objective function comprises alternatively fixing the circulant embedding matrix and the binary matrix.

In some implementations optimizing the objective function by fixing the circulant embedding matrix comprises updating the i-jth entry of the binary matrix to +1 if the scalar product of the i-th row of the circulant embedding matrix with the j-th column of the training data matrix is greater than or equal to zero, or −1 if the scalar product of the i-th row of the circulant embedding matrix with the j-th column of the training data matrix is less than zero.

In certain aspects optimizing the objective function by fixing the binary matrix comprises optimizing the objective function with respect to the Discrete Fourier Transform (DFT) of the entries of the single vector.

In some implementations the circulant embedding matrix is a d-dimensional matrix, the training data matrix is a n by d dimensional matrix, and learning the elements of the circulant embedding matrix comprises updating the i-jth entry of the binary matrix to zero for i=0, . . . , n−1 and j=k, . . . , d−1.

In certain aspects the training data matrix includes labeled pairs of similar and dissimilar vectors and learning each element of the circulant embedding matrix comprises semi-supervised learning.

In additional aspects semi-supervised learning comprises optimizing a second objective function comprising the first objective function and an additional objective term that maximizes the distance between dissimilar pairs of vectors and minimizes the distance between similar pairs of vectors.

In some implementations converting circulant embedding matrix multiplication to circular convolution comprises replacing the product of the circulant embedding matrix and the high-dimensional data item with the circular convolution of the single vector that fully specifies the circulant embedding matrix and the high-dimensional data item.

In certain aspects the binary map maps the elements of a vector to either +1 or −1.

In additional aspects the plurality of high-dimensional data items are vectors with dimension d and the binary map performs a d-bit binary embedding and produces a d dimensional compact representation.

In certain aspects the plurality of high-dimensional data items are vectors with dimension d and for k<d the binary map performs a k-bit binary embedding and produces a k dimensional compact representation by taking the first k elements of the binary map.

In some implementations the method may include performing a random sign flipping on the high-dimensional data item prior to determining the product of the circulant embedding matrix and the high-dimensional data item, wherein performing the ransom sign flipping on the high-dimensional data item comprises applying a diagonal matrix to the high-dimensional data item, wherein the diagonal matrix is a matrix whose entries outside the main diagonal are all zero, and the diagonal entries on the main diagonal are Rademacher random variables that take the values +1 and −1 with equal probability.

The subject matter in this specification can be implemented in particular embodiments so as to realize one or more of the following advantages. In some implementations a circulant binary embedding system may generate a compact binary representation of high-dimensional input data by projecting the data with a circulant matrix. The circulant binary embedding system may provide space efficiency, since the system may store a single vector to represent the circulant matrix. Additionally, the circulant structure of the circulant binary embedding system may enable the use of the Fast Fourier Transform, improving the performance of the system computations relative to conventional binary embedding systems that do not have a circulant structure. In some implementations, compared to systems that use unstructured matrices, a circulant binary embedding system can perform binary embedding of very high-dimensional data sets with reduced computational complexity from $\mathcal{O}(9(d^2))$ to $\mathcal{O}(9(d \log d))$ and increased space complexity from $\mathcal{O}(9(d^2))$ to $\mathcal{O}(9(d))$. Additionally, a circulant binary embedding system may allow for efficient learning and retrieval processes to occur directly in binary space.

A circulant binary embedding system may be efficiently trained to learn data-dependent projections using a time-frequency alternating optimization, which alternatively minimizes the objective function in original and Fourier domains. The alternating optimization process may result in improved computational efficiency compared to conventional binary embedding systems that do not have a circulant structure and may provide faster computational processes with no performance degradation for a fixed number of bits.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
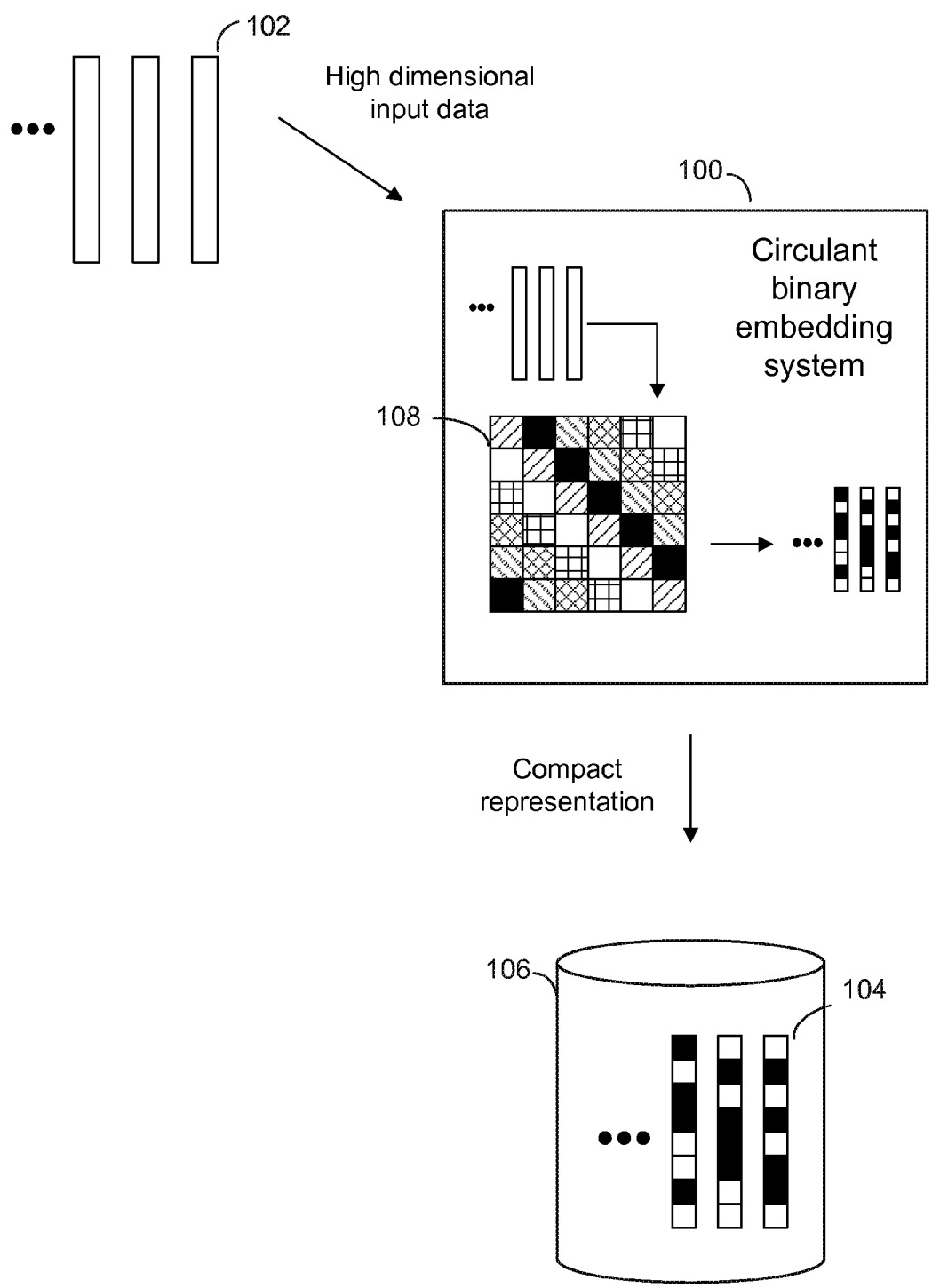
FIG. 1 is an example of a circulant binary embedding system.

FIG. 1 shows an example circulant binary embedding system 100. The circulant binary embedding system 100 is an example of a system implemented as computer programs on one or more computers in one or more locations, in which the systems, components, and techniques described below can be implemented.

The circulant binary embedding system 100 is a system that receives high-dimensional input data 102 and generates as an output compact representations 104 of the input data. The circulant binary embedding system 100 can store the generated compact representation of the input data in an output data repository 106 or provide the compact representation for use for some other immediate purpose.

The circulant binary embedding system 100 can be configured to receive any kind of high-dimensional data items as input and to generate compact representations of the high-dimensional data items as output based on the input. For example, the input to the circulant binary embedding system can be massive, high-dimensional data sets of high-dimensional data items. Generally, a high-dimensional data item is a data item, e.g., a vector, with hundreds or millions of dimensions.

The circulant binary embedding system 100 is associated with a circulant embedding matrix 108 for the high-dimensional input data 102. The circulant embedding matrix is a circulant matrix. Generally, a circulant matrix is a matrix that is fully specified by a single vector. In particular, the single vector that fully specifies the circulant matrix appears as the first row, i.e., the top row, of the matrix. Each subsequent row of the circulant matrix is a vector whose entries are rotated one entry to the right relative to the preceding row vector in the circulant matrix. In some implementations, the single vector that fully specifies the circulant matrix appears as the first column, e.g., the left-most column, of the matrix. Each subsequent column in the circulant matrix is a column vector whose entries are rotated one entry below relative to the preceding column vector in the circulant matrix.

The circulant binary embedding system 100 is configured to generate a compact representation of an input data item by modifying the input data item in accordance with the entries of the circulant embedding matrix 108 associated with the data input. Processing a high-dimensional input data item using a circulant binary embedding system is described in more detail below with reference to FIG. 3.

The output generated by the circulant binary embedding system 100 for a given high-dimensional data item may be a compact, binary representation for the data item 104. The circulant binary embedding system 100 can store the output in an output data repository 106 or provide the output for use for some other immediate purpose.

For example, the compact representation of the data item could be provided in place of the high-dimensional data item as input to a machine learning system, e.g., as a feature of the high-dimensional data item to be processed by the system to generate an output.

As another example, the compact representations of each data item in the high-dimensional data set can be used to determine similarity between data items in the data set. For example, the data items can be clustered by using a conventional clustering technique to cluster the corresponding compact representations, i.e., without having to perform the clustering technique on the high-dimensional data items themselves.

As another example, the compact representations can be used to identify similar data items to a newly-received data items. That is, once a respective compact representation has been generated for each item in a data set, a new data item may be received by the circulant binary embedding system 100. The circulant binary embedding system 100 can process the new data item to determine a compact representation for the new data item. The circulant binary embedding system 100 can then determine a similarity measure between the compact representation for the new data item and compact representations of data items in the data, e.g., a hamming distance, and select data items that are similar to the new data item by selecting one or more data items having compact representations that are most similar to the compact representation for the new data item according to the similarity measures.

Figure 2:
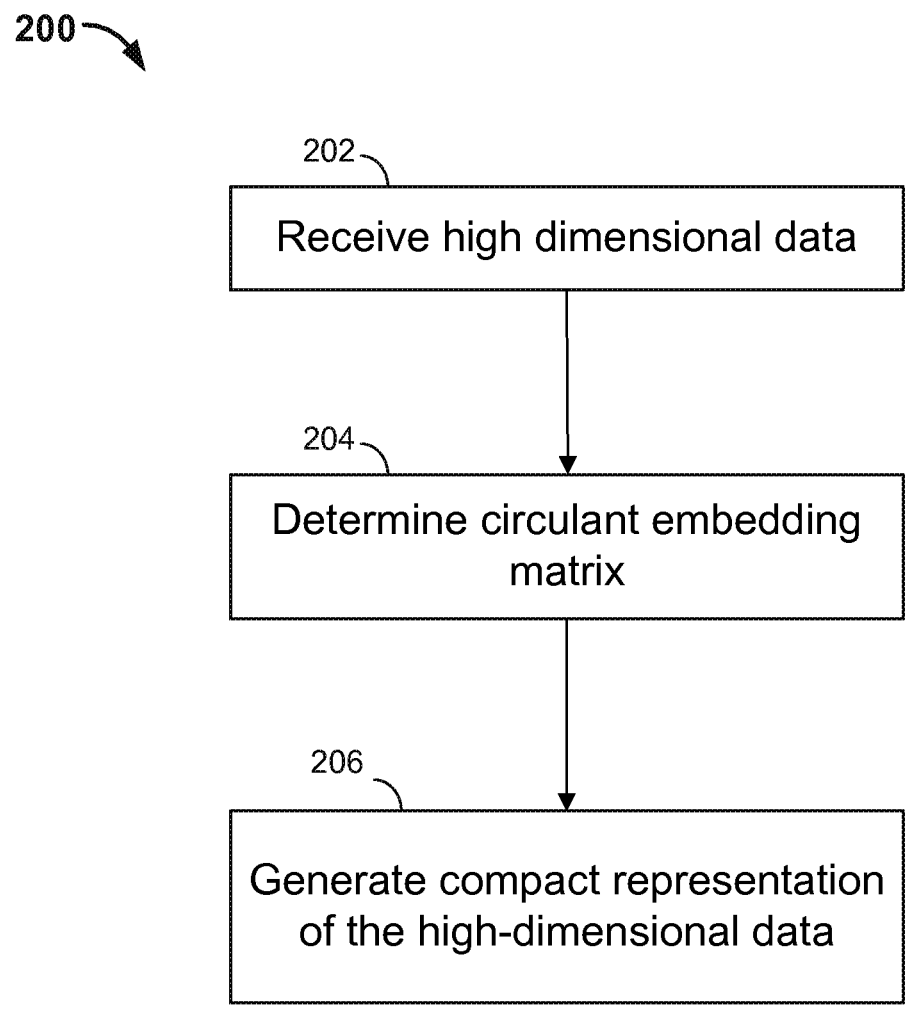
FIG. 2 is a flow diagram of an example process for generating compact representations of a set of high-dimensional data items using a circulant binary embedding system.

FIG. 2 is a flow diagram of an example process for generating compact representations of a set of high-dimensional data items using a circulant binary embedding system. For convenience, the process 200 will be described as being performed by a system of one or more computers located in one or more locations. For example, a circulant binary embedding system such as the circulant binary embedding system 100 of FIG. 1, appropriately programmed in accordance with this specification, can perform the process 200.

The system receives a set of high-dimensional data items, for example a set of vectors $x \in \mathbb{R}^d$, that represent a high-dimensional set of data (step 202).

The system determines the corresponding vector r that specifies the circulant embedding matrix R for the data set (step 204). For example, the vector $r=r(r_0, r_1, \ldots, r_{d-1})$ specifies the circulant matrix $R \in \mathbb{R}^{d \times d}$ as given by equation (1) below. In some implementations, the system applies a randomized circulant binary embedding process and generates the entries of the vector r, and in turn the entries of the circulant embedding matrix, independently from a standard normal distribution. In other implementations, the system applies a data-dependent technique and learns the entries of the vector r. Learning the entries of the vector r is described in more detail below with reference to FIG. 4.

$$R = circ(r) = \begin{pmatrix} r_0 & r_{d-1} & \ldots & r_1 \\ r_1 & r_0 & \ldots & \vdots \\ \vdots & r_1 & \ddots & r_{d-1} \\ r_{d-1} & \vdots & \ldots & r_0 \end{pmatrix} \quad (1)$$

The system uses the circulant embedding matrix to generate a respective compact representation of each data item in the high-dimensional data set (step 206). For each high-dimensional data item in the high-dimensional set of data, the system generates a corresponding compact representation of the high-dimensional data item by projecting the high-dimensional data item with the circulant embedding matrix.

Figure 3:
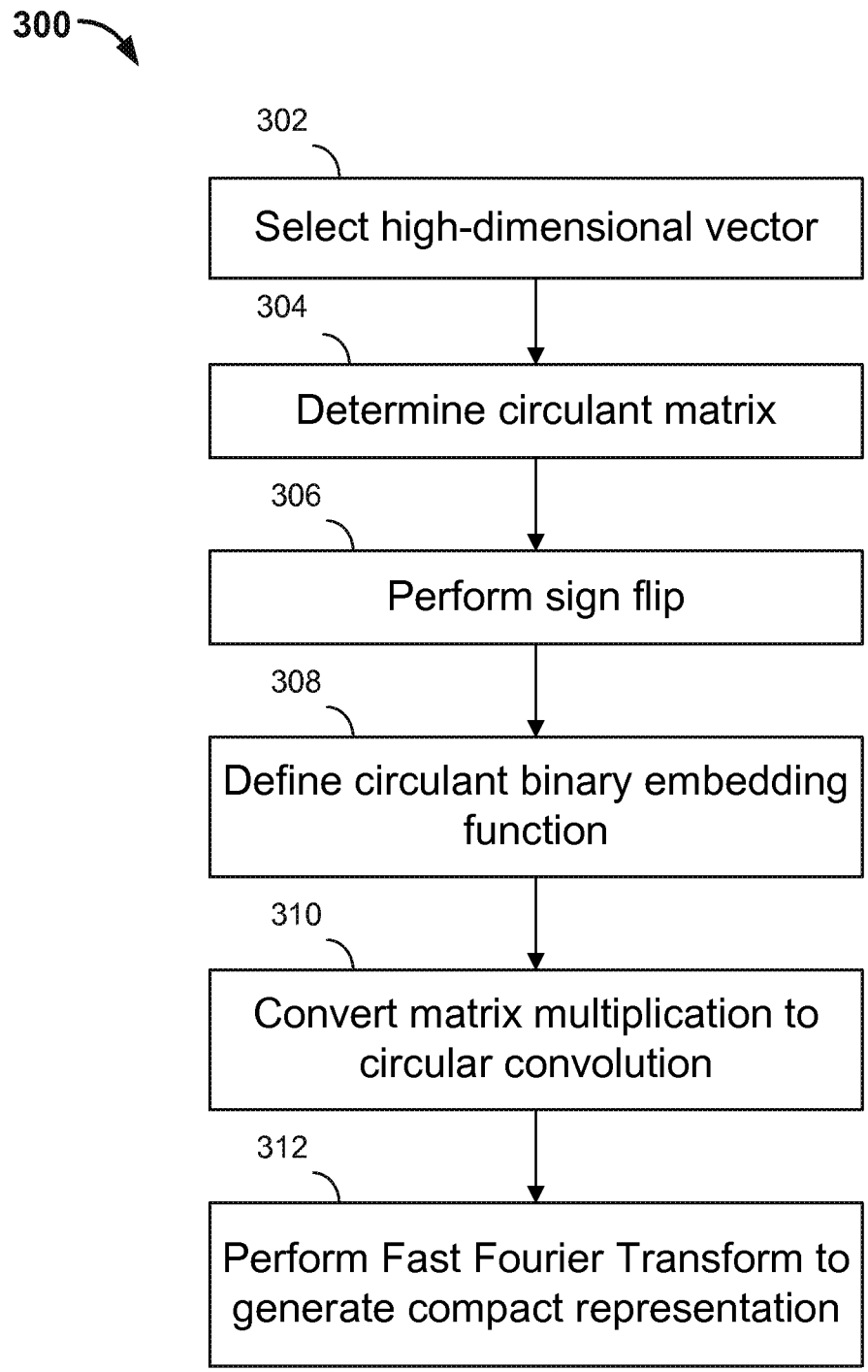
FIG. 3 is a flow diagram of an example process for generating a compact vector representation of a high-dimensional data vector.

FIG. 3 is a flow diagram of an example process for generating a compact vector representation of a high-dimensional data vector. For convenience, the process 300 will be described as being performed by a system of one or more computers located in one or more locations. For example, a circulant binary embedding system such as the circulant binary embedding system 100 of FIG. 1, appropriately programmed in accordance with this specification, can perform the process 300.

The system selects a high-dimensional vector $x \in \mathbb{R}^d$ from the set of high-dimensional vectors that represent a high-dimensional set of data (step 302).

The system determines the corresponding vector r that specifies the corresponding circulant embedding matrix R (step 304).

Optionally, the system performs a random sign flipping on the vector x (step 306). To perform the random sign flipping, the system applies a diagonal matrix D to the vector. The diagonal matrix is a matrix whose entries outside the main diagonal are all zero. In some implementations, the diagonal entries on the main diagonal are Rademacher random variables taking the values of +1 and −1 with equal probability.

The system defines a d-bit circulant binary embedding function h(x) (step 308). The circulant binary embedding function is dependent on the product of the circulant matrix R and the vector x or, if the pre-processing step is performed, the vector after the random sign flipping has been performed, as given by equation (2) below. In equation (2), sign (.) is a binary map which returns element-wise sign, i.e., sign (.) is an operator that acts on the vector RDx and returns a vector wherein each entry of the returned vector is either +1 or −1 depending on whether the corresponding entry of the vector RDx is a positive or negative number respectively.

$$h(x)=\text{sign}(RDx), R=circ(r) \quad (2)$$

The system computes the d-bit circulant binary embedding function h(x) using the circulant structure of the circulant matrix R. The system converts the circulant matrix multiplication computation RDx to a circular convolution computation $r \circledast Dx$ (step 310). The circular convolution is computed more efficiently in the Fourier domain, using the Discrete Fourier Transform (DFT) for which a Fast Fourier Transform (FFT) algorithm is available.

The system performs a FFT to compute the d-bit circulant binary embedding as shown below in equation (3) and generate a compact representation of the vector x (step 312).

$$h(x)=\text{sign}((\mathscr{F}^{-1}(\mathscr{F}(r) \circ \mathscr{F}(Dx))) \quad (3)$$

In equation (3), $\mathscr{F}(.)$ is the operator of the DFT, and $\mathscr{F}^{-1}(.)$ is the operator of the inverse DFT. The DFT and inverse DFT can be efficiently computed with time complexity $\mathcal{O}(d \log d)$ using a FFT algorithm. In addition, computational resources are reduced since the circulant matrix R is never explicitly computed or stored. The storage of the model, consisting of storing r and the diagonal entries of D takes $\mathcal{O}(d)$ space.

The dimension of the generated compact representation of the vector x is dependent on the circulant binary embedding process. In some implementations, the system performs a d-bit circulant binary embedding process and generates a compact representation of the vector $x \in \mathbb{R}^d$ that is of the same dimension as the vector x, i.e., dimension d. In other implementations, the system performs a k-bit circulant binary embedding process and generates a compact representation of the vector $x \in \mathbb{R}^d$ that has a smaller dimension than the vector x, i.e., dimension k<d. To generate the compact representation of the vector x using a k-bit circulant binary embedding process the system selects the first k bits of h(x).

Figure 4:
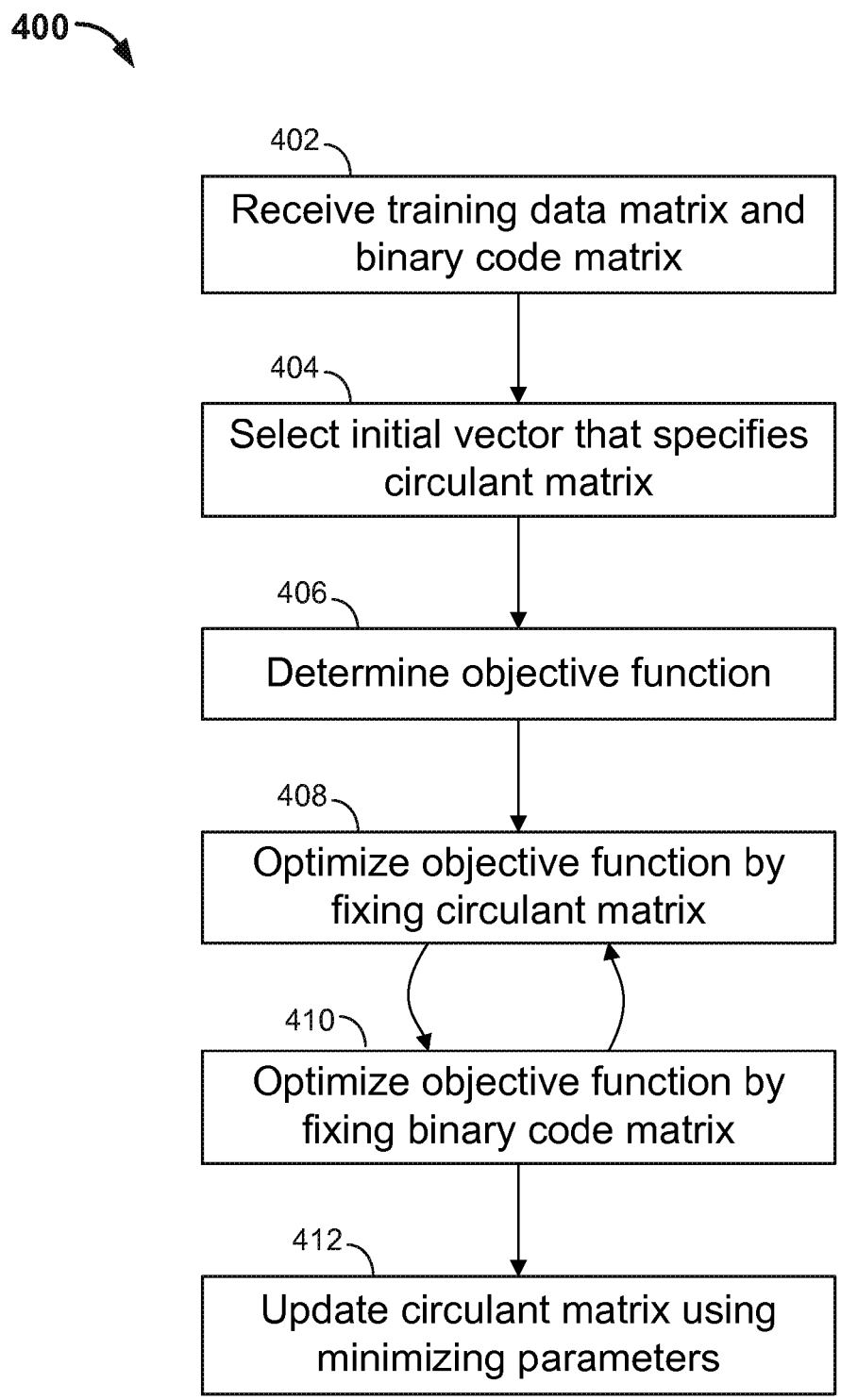
FIG. 4 is a flow diagram of an example process for learning circulant binary embedding.

FIG. 4 is a flow diagram of an example process for learning d-bit circulant binary embedding. For convenience, the process 300 will be described as being performed by a system of one or more computers located in one or more locations. For example, a circulant binary embedding system such as the circulant binary embedding system 100 of FIG. 1, appropriately programmed in accordance with this specification, can perform the process 400.

The system receives a training data matrix $X \in \mathbb{R}^{n \times d}$ containing n training vectors $X=[x_0, x_1, \ldots, x_{n-1}]^T$ (step 402). In some implementations, the system may perform a random sign flipping on the training data input X.

The system selects initial values for the entries of the vector r that specifies the circulant matrix R for the set of training data vectors (step 404). For example, the vector $r=(r_0, r_1, \ldots, r_{d-1}$ the circulant matrix $R \in \mathbb{R}^{d \times d}$ as given by equation (1) above. In some implementations the initial values for the entries of the vector r maybe assigned at random, e.g., from sampling a standard Gaussian distribution.

The system computes a binary code matrix $B \in \{-1, 1\}^{n \times d}$ where B=sign (RX) (step 406).

The system determines an objective function to optimize for determining learned values for the entries of the vector r that specifies the circulant embedding matrix R, that is for learning the d-bit circulant binary embedding (step 408). The objective function is dependent on the training data matrix X, the binary code matrix B and the circulant matrix R, and is given by equation (4) below.

$$\underset{B,r}{\operatorname{argmin}} \|B - XR^T\|_F^2 + \lambda \|RR^T - I\|_F^2 \quad (4)$$

$$\text{s.t.} \quad R = circ(r)$$

In equation (4), F is the Frobenius norm and $\lambda$ is a predetermined constant. The first term minimizes the distortion due to binarization. The second term tries to make the rows of the circulant matrix R, and hence the corresponding bits, as uncorrelated as possible, which reduces the redundancy in the learned code.

The system optimizes the objective function with respect to the entries of the binary matrix B and the entries of the vector r using a time-frequency alternating optimization. The system alternately optimizes the objective function by fixing r and B respectively.

The system optimizes the objective function by fixing the entries of the circulant matrix, that is by fixing r, and solving the optimization for B (step 410). When r is fixed, the objective function is independent for each element of B. The system therefore updates the i-jth element of B to take the value +1 if $R_j x_i \geq 0$, and $-1$ if $R_j x_i < 0$.

The system then optimizes the objective function by fixing B (step 412). The system solves the optimization for $\tilde{r}$, where $\tilde{r} := \mathcal{F}(r)$ is the Discrete Fourier Transform (DFT) of the vector r. The vector r may be recovered from $\tilde{r}$ using an inverse DFT. When solving for $\tilde{r}$, the objective function may be decomposed into two sets of optimization problems, each comprising a $4^{th}$ order polynomial. The first optimization problem has one variable, and the system may determine the minima by computing the closed form solution. The second has two variables, and the system may use a gradient descent algorithm to determine a local minima. The system updates the elements of the circulant matrix R using the minimizing vector r recovered from $\tilde{r}$ using an inverse DFT.

The system repeats the alternating optimization of the objective function (steps 410 and 412) until termination criteria are satisfied, e.g., a fixed number of iterations are completed or the change in the objective function falls below a predetermined threshold, and a set of minimizing entries that optimizes the circulant matrix R is learned. The system uses the minimizing entries to define the learned circulant embedding matrix R (step 414). The learned circulant embedding matrix may be used by the circulant binary embedding system in processes for generating compact representations for high-dimensional data sets.

In some implementations the system may learn k-bit circulant binary embedding, where k<d. The system determines an objective function to optimize for learning the k-bit CBE, as given by equation (5) below.

$$\underset{B,r}{\operatorname{argmin}} \|BP_k - XP_k^T R^T\|_F^2 + \lambda \|RP_k P_k^T R^T - I\|_F^2 \quad (5)$$

$$\text{s.t.} \quad R = circ(r), \text{ where } P_k = \begin{pmatrix} I_k & O \\ O & O_{d-k} \end{pmatrix}$$

In equation (5), $I_k$ is a k×k identity matrix, $O_{d-k}$ is a (d−k)×(d−k) all zero matrix and B is a binary matrix. To perform the optimization, the system sets the i-jth element of B to take the value 0 for i=0, . . . , n−1, j=k, . . . , d−1. The optimization process then remains the same as the optimizing process described above (steps 406-412).

In some implementations, instead of performing the process 400 to determine learned values of the entries of the circulant embedding matrix, the entries of the corresponding vector that fully specifies the circulant embedding matrix may be generated randomly, e.g., independently from a standard normal distribution.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory program carrier for execution by, or to control the operation of, data processing apparatus. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them. The computer storage medium is not, however, a propagated signal.

The term "data processing apparatus" encompasses all kinds of apparatus, devices, and machines for processing data, including by way of example a programmable processor, a computer, or multiple processors or computers. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a stand alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites.

As used in this specification, an "engine," or "software engine," refers to a software implemented input/output system that provides an output that is different from the input. An engine can be an encoded block of functionality, such as a library, a platform, a software development kit ("SDK"), or an object. Each engine can be implemented on any appropriate type of computing device, e.g., servers, mobile phones, tablet computers, notebook computers, music players, e-book readers, laptop or desktop computers, PDAs, smart phones, or other stationary or portable devices, that includes one or more processors and computer readable media. Additionally, two or more of the engines may be implemented on the same computing device, or on different computing devices.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the user device, which acts as a client. Data generated at the user device, e.g., as a result of the user interaction, can be received from the user device at the server.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A computer-implemented method comprising:
   receiving a plurality of high-dimensional data items;
   generating a circulant embedding matrix for the high-dimensional data items, wherein the circulant embedding matrix is a matrix that is fully specified by a single vector, and wherein generating the circulant embedding matrix comprises learning each element of the single vector that fully specifies the circulant embedding matrix, comprising:
  receiving a training data matrix which represents a set of training data;
  determining a binary matrix by computing a binary map of the product of the training data matrix and an initial circulant embedding matrix; and
  optimizing an objective function that is dependent on the circulant embedding matrix, the training data matrix, and the binary matrix such that a distortion due to binarization and correlation between the rows of the circulant embedding matrix are minimized;
for each high-dimensional data item, generating a compact representation of the high-dimensional data item, comprising:
  computing a product of the circulant embedding matrix and the high dimensional data item by performing a circular convolution of the single vector that fully specifies the circulant embedding matrix and the high dimensional data item using a Fast Fourier Transform (FFT);
  generating a compact representation of the high dimensional data item by computing a binary map of the computed product; and
providing the compact representations of the high-dimensional data items in place of the high-dimensional data items as input to a machine learning system.

2. The method of claim 1, wherein generating the circulant embedding matrix comprises generating each element of the single vector that fully specifies the circulant embedding matrix independently from a standard normal distribution.

3. The method of claim 1, wherein optimizing the objective function comprises alternatively fixing the circulant embedding matrix and the binary matrix.

4. The method of claim 3, wherein optimizing the objective function by fixing the circulant embedding matrix comprises updating an i-jth entry of the binary matrix to +1 if the scalar product of the i-th row of the circulant embedding matrix with the j-th column of the training data matrix is greater than or equal to zero, or −1 if the scalar product of the i-th row of the circulant embedding matrix with the j-th column of the training data matrix is less than zero.

5. The method of claim 3, wherein optimizing the objective function by fixing the binary matrix comprises optimizing the objective function with respect to a Discrete Fourier Transform (DFT) of the entries of the single vector.

6. The method of claim 1, wherein the circulant embedding matrix is a d-dimensional matrix, the training data matrix is a n by d dimensional matrix, and learning the elements of the circulant embedding matrix comprises updating an i-jth entry of the binary matrix to zero for i=0, . . . , n−1 and j=k, d−1.

7. The method of claim 1, wherein the training data matrix includes labeled pairs of similar and dissimilar vectors and learning each element of the circulant embedding matrix comprises semi-supervised learning.

8. The method of claim 7, wherein semi-supervised learning comprises optimizing a second objective function comprising the first objective function and an additional objective term that maximizes a distance between dissimilar pairs of vectors and minimizes a distance between similar pairs of vectors.

9. The method of claim 1, wherein computing a product of the circulant embedding matrix and the high dimensional data item comprises replacing the product of the circulant embedding matrix and the high-dimensional data item with a circular convolution of the single vector that fully specifies the circulant embedding matrix and the high-dimensional data item.

10. The method of claim 1, wherein the binary map maps the elements of a vector to either +1 or −1.

11. The method of claim 1, wherein the plurality of high-dimensional data items are vectors with dimension d and the binary map performs a d-bit binary embedding and produces a d dimensional compact representation.

12. The method of claim 1, wherein the plurality of high-dimensional data items are vectors with dimension d and for k<d the binary map performs a k-bit binary embedding and produces a k dimensional compact representation by taking the first k elements of the binary map.

13. The method of claim 1, further comprising performing a random sign flipping on the high-dimensional data item prior to determining the product of the circulant embedding matrix and the high-dimensional data item.

14. The method of claim 13, wherein performing the random sign flipping on the high-dimensional data item comprises applying a diagonal matrix to the high-dimensional data item, wherein the diagonal matrix is a matrix whose entries outside the main diagonal are all zero, and the diagonal entries on the main diagonal are Rademacher random variables that take the values +1 and −1 with equal probability.

15. The method of claim 1, wherein the single vector appears as a first row of the matrix and each subsequent row vector in the circulant embedding matrix is a vector whose entries are rotated one entry to the right relative to a preceding row vector in the circulant embedding matrix.

16. The method of claim 1, wherein the single vector appears as a first column of the matrix and each subsequent column in the circulant embedding matrix is a column vector whose entries are rotated one entry below relative to a preceding column in the circulant embedding matrix.

17. A system comprising one or more computers and one or more storage devices storing instructions that are operable, when executed by the one or more computers, to cause the one or more computers to perform operations comprising:
  receiving a plurality of high-dimensional data items;
  generating a circulant embedding matrix for the high-dimensional data items, wherein the circulant embedding matrix is a matrix that is fully specified by a single vector, and wherein generating the circulant embedding matrix comprises learning each element of the single vector that fully specifies the circulant embedding matrix, comprising:
    receiving a training data matrix which represents a set of training data;
    determining a binary matrix by computing a binary map of the product of the training data matrix and an initial circulant embedding matrix; and
    optimizing an objective function that is dependent on the circulant embedding matrix, the training data matrix, and the binary matrix such that a distortion due to binarization and correlation between the rows of the circulant embedding matrix are minimized;
  for each high-dimensional data item, generating a compact representation of the high-dimensional data item, comprising:
    computing a product of the circulant embedding matrix and the high dimensional data item by performing a circular convolution of the single vector that fully specifies the circulant embedding matrix and the high dimensional data item using a Fast Fourier Transform (FFT);

generating a compact representation of the high dimensional data item by computing a binary map of the computed product; and providing the compact representations of the high-dimensional data items in place of the high-dimensional data items as input to a machine learning system.

18. A non-transitory computer storage medium encoded with instructions that, when executed by one or more computers, cause the one or more computers to perform operations comprising:

receiving a plurality of high-dimensional data items;

generating a circulant embedding matrix for the high-dimensional data items, wherein the circulant embedding matrix is a matrix that is fully specified by a single vector, and wherein generating the circulant embedding matrix comprises learning each element of the single vector that fully specifies the circulant embedding matrix, comprising:

receiving a training data matrix which represents a set of training data;

determining a binary matrix by computing a binary map of the product of the training data matrix and an initial circulant embedding matrix; and optimizing an objective function that is dependent on the circulant embedding matrix, the training data matrix, and the binary matrix such that a distortion due to binarization and correlation between the rows of the circulant embedding matrix are minimized;

for each high-dimensional data item, generating a compact representation of the high-dimensional data item, comprising:

computing a product of the circulant embedding matrix and the high dimensional data item by performing a circular convolution of the single vector that fully specifies the circulant embedding matrix and the high dimensional data item using a Fast Fourier Transform (FFT);

generating a compact representation of the high dimensional data item by computing a binary map of the computed product; and providing the compact representations of the high-dimensional data items in place of the high-dimensional data items as input to a machine learning system.

* * * * *